(12) United States Patent
Oyamada

(10) Patent No.: US 6,904,933 B2
(45) Date of Patent: Jun. 14, 2005

(54) ENCLOSURE FOR OUTDOOR EQUIPMENT

(75) Inventor: Takashi Oyamada, Tokyo (JP)

(73) Assignee: NEC Corporation, Tokyo (JP)

(*) Notice: Subject to any disclaimer, the term of this patent is extended or adjusted under 35 U.S.C. 154(b) by 297 days.

(21) Appl. No.: 10/216,749

(22) Filed: Aug. 13, 2002

(65) Prior Publication Data

US 2003/0036307 A1 Feb. 20, 2003

(30) Foreign Application Priority Data

Aug. 16, 2001 (JP) .......................... 2001-247248

(51) Int. Cl.⁷ ........................ F16K 24/04; H05K 5/06
(52) U.S. Cl. .................. 137/541; 174/17 VA; 251/337
(58) Field of Search .............................. 137/541, 542; 174/11 R, 17 VA; 220/203.23, DIG. 27; 251/337; 454/184

(56) References Cited

U.S. PATENT DOCUMENTS 4,559,969 A * 12/1985 Ulming ..................... 137/540
6,497,248 B2 * 12/2002 Herz ..................... 137/516.29

FOREIGN PATENT DOCUMENTS

| DE | 3146030 A1 | * | 5/1983 |
| JP | 62-200869 U | | 12/1987 |
| JP | 9-66889 A | | 3/1997 |
| JP | 9-193890 A | | 7/1997 |

* cited by examiner

Primary Examiner—Ramesh Krishnamurthy
(74) Attorney, Agent, or Firm—Sughrue Mion, PLLC (57) ABSTRACT

An enclosure for outdoor equipment, which can prevent the enclosure from being damaged by a rise of air pressure inside the enclosure by exhausting air from the enclosure, and further can secure safety of the enclosure and can secure easiness for fixing an inside air pressure adjusting mechanism to the enclosure and also can prevent a dew condensation from occurring in the enclosure, is provided. The enclosure for outdoor equipment provides an inside air pressure adjusting mechanism. The inside air pressure adjusting mechanism provides a valve seat and a valve element which is seated on the valve seat in a state that the valve element can be opened and closed by placing a sealing component between them. The inside air pressure adjusting mechanism is inserted to a hole of the enclosure for outdoor equipment, in which an electronic circuit is disposed, and fixed so that the inside air pressure adjusting mechanism does not stick out largely from the front surface of the enclosure for outdoor equipment. With this, the atmosphere can be prevented from entering the enclosure and the air inside the enclosure is exhausted to the outside corresponding to a rise of the temperature inside the enclosure.

9 Claims, 6 Drawing Sheets

ENCLOSURE FOR OUTDOOR EQUIPMENT

BACKGROUND OF THE INVENTION

The present invention relates to an enclosure for outdoor equipment, in particular, which has an inside air pressure adjusting mechanism.

DESCRIPTION OF THE RELATED ART

Conventionally, an enclosure having an inside air pressure adjusting mechanism, in which an inside electronic circuit is not damaged by an outside environment, has been developed. However, in case that the enclosure is completely airtight, the inside air pressure is raised by heat generated by its inside electronic circuit or heat conducted from the outside, and in some cases, the enclosure is damaged. In order to solve this problem, the enclosure has a mechanism, which exhausts air to the outside corresponding to the rise of the air pressure.

Figure 1:
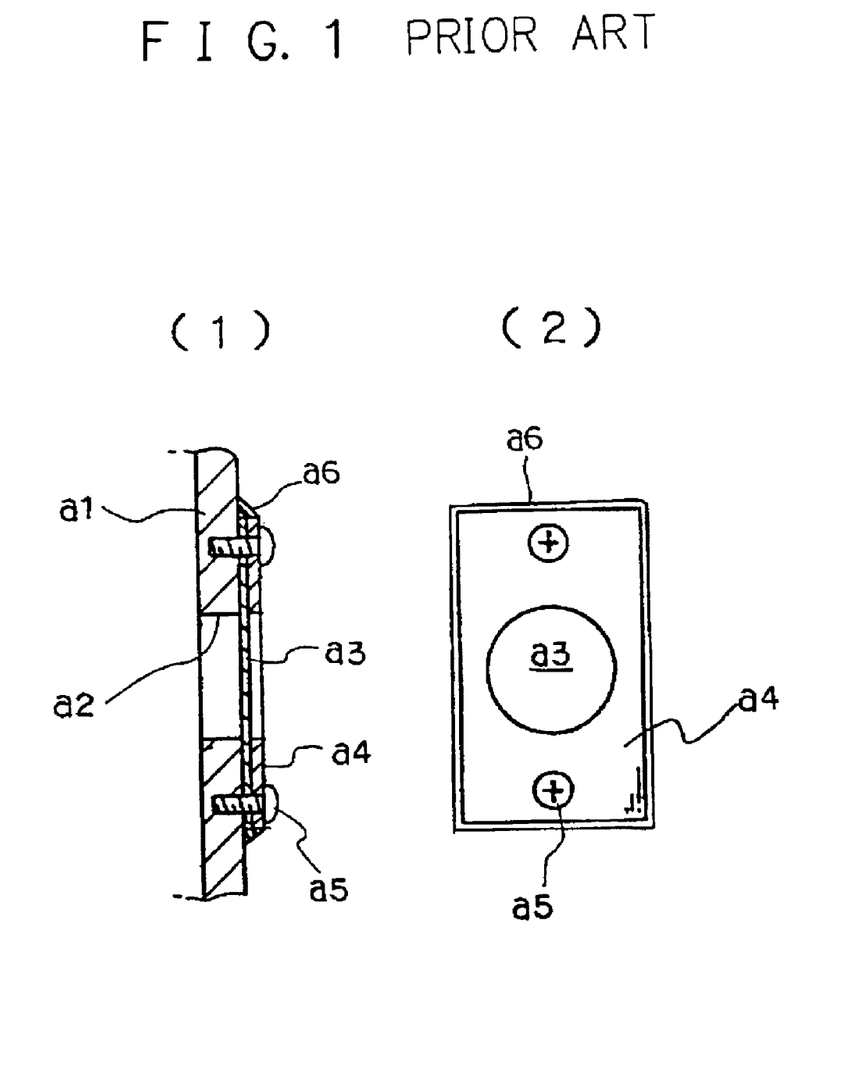
FIG. 1 is a diagram showing a plan view and a sectional view of a part of a conventional enclosure having an inside air pressure adjustment mechanism.

FIG. 1 is a diagram showing a plan view and a sectional view of a part of a conventional enclosure having an inside air pressure adjustment mechanism. In FIG. 1 (1), the sectional view of a part of the conventional enclosure having the inside air pressure adjusting mechanism is shown, and in FIG. 1 (2), the plan view of a part of the conventional enclosure having the inside air pressure adjusting mechanism is shown. In this conventional enclosure having the inside air pressure adjusting mechanism, a tetrafluoro-ethylene resin filter, which has a property that lets air pass and does not let water pass, is used. That is, a hole connecting the outside and inside surfaces of the enclosure is provided, and the hole is covered with the filter.

As shown in FIG. 1, a hole a2 of an enclosure a1 is covered with a filter a3 tightly, and a plate a4 having a hole, whose diameter is almost equal to the hole a2, is placed on the filter a3. And the plate a4 is fixed to the enclosure a1 having the filter a3 by using screws a5. After this, the edge of the filter a3 and the edge of the plate a4 are sealed by a sealing material a6. With this structure, the air pressure inside the enclosure a1 is prevented from rising by using the filter a3.

There is a valve structure as a typical means for adjusting inside air pressure, and this valve structure is used in various technical fields. Japanese Utility Model Application Laid-Open No. SHO 62-200869 discloses a waterproof vent valve structure. Japanese Patent Application Laid-Open No. HEI 9-66889 discloses a waterproof suit. And Japanese Patent Application Laid-Open No. HEI 9-193890 discloses an air supplying and exhausting valve for a dry suit.

The waterproof vent valve structure of the Japanese Utility Model Application Laid-Open No. SHO 62-200869 is a waterproof vent valve structure, which is provided at a waterproof case, using in such as an automobile, in which a pressure sensor made of a semiconductor pressure element is disposed. In this waterproof vent valve structure, a disk shape rubber sheet, in which slits letting air pass are provided in its inner circle side, is made to be an elastic valve. And this elastic valve is set inside the case in a state that the elastic valve is curved in the inside direction of the case, and the case has ventilation holes. When inside air pressure of the case rises, air is exhausted to the outside through the slits and the ventilation holes.

In the Japanese Patent Application Laid-Open No. HEI 9-66889, a waterproof suit, which can exhaust air inside the waterproof suit with a good balance and also can keep the posture of the user in a good state in the water, is disclosed. In order to achieve these mentioned above, the positions of exhaust valves and also the structure of the exhaust valves have specific characteristics. In this valve structure, a valve element being a flange type, in which a ring valve, made of an elastic material, is fixed to a valve holder in a state that the outer side of the ring valve is stuck out, is provided. And the flange convex part of the valve element is placed to the inner side of the waterproof suit, and the edge part of the valve element is contacted with a base part of the valve structure by the force of springs placed at the back side of the flange convex part of the valve element. And the front side of the valve element is covered with a cover having ventilation holes. In this valve structure, when the air pressure rises by the air staying in the waterproof suit, the valve element is pushed up and a gap is formed between the ring valve and the base part, and the air is exhausted from the ventilation holes.

The air supplying and exhausting valve for the dry suit in the Japanese Patent Application Laid-Open No. HEI 9-193890 adopts an existing pushing type angle valve. And this pushing type angle valve is used for exhausting air from the dry suit when diving and for supplying air to the dry suit when rising to the surface. An air supplying button and an air exhausting button, which are connected to the angle valves, are disposed on the outside surface of the dry suit by connecting these buttons as one unit. And when one of the buttons is pushed, one of the valves connecting to springs is opened, and air is exhausted from the dry suit or is supplied to the dry suit.

As mentioned above, the porous property of the tetrafluoro-ethylene resin filter lets air pass and does not let water pass, and each hole diameter of this material is about 0.1 $\mu$m to a few $\mu$m practically. However, the atmosphere, in which outdoor equipment is used, contains sulfur dioxide, salt containing particles, metal particles, and so fourth, which can pass through the holes of the filter. Consequently, poisonous gasses mentioned above pass between the outdoor equipment and the atmosphere, and are accumulated in the outdoor equipment. As a result, this causes lowering the reliability of the outdoor equipment. Further, in some cases, dust in the atmosphere is adhered to the filter, and the filter is clogged and its air pressure adjusting function is lowered.

Moreover, this filter is by no means high in its mechanical strength, in a case, this filter is broken by insects such as ants, depending on its placing position. In order to avoid this problem, a net must be put on the outdoor equipment practically so that the insects do not enter the outdoor equipment. In addition to this, a dew condensation occurs in the enclosure for outdoor equipment, by that vapor containing in the atmosphere passed through the filter is condensed at the time when the temperature inside the enclosure falls by the cause of the temperature difference between the atmosphere and the outdoor equipment. Therefore, this problem must be solved.

In order to solve these problems mentioned above, the conventional technologies mentioned above are studied.

At the waterproof vent valve structure of the Japanese Utility Model Application Laid-Open No. SHO 62-200869, a disk shape rubber sheet, in which slits letting air pass are provided in its inner circle side, is made to be an elastic valve, is adopted. Consequently, its reliability in operation is lowered. That is, generally, rubber materials have dispersion in the degree of elastic deformation, therefore, when the slits are bent by the inside air pressure, the slits are not always opened corresponding to a predetermined air pressure. On the contrarily, there is a possibility that the slits are opened at air pressure being lower than the predetermined air pressure. Further, it is mentioned that vapor is prevented from entering the case. However, when the elastic valve having the slits in its inner circle side is curved in a convex shape, molecules of vapor, whose diameter is 0.1 μm or less, pass through the slits. Consequently, there is a problem that the reliability is lowered in the degree of waterproof.

At the waterproof suit of the Japanese Patent Application Laid-Open No. HEI 9-66889, a user wears the waterproof suit, therefore, the mechanism of the valve structure can not be disposed inside the waterproof suit. Consequently, the mechanism of the valve structure is disposed outside the waterproof suit and the valve element is kept at the outside position by the force of the springs. That is, the mechanism of the valve structure is stuck out from the waterproof suit, and there is a possibility that the mechanism of the valve structure is damaged by a collision of users or by hitting of flowing objects caused by a storm. Moreover, when users collide with each other, there is a possibility that the users are injured.

At the air supplying and exhausting valve for the dry suit in the Japanese Patent Application Laid-Open No. HEI 9-193890, the air supplying button and the air exhausting button are disposed on the outside surface of the dry suit. And when one of the buttons is pushed, one of the valves connecting to springs is opened, and air is exhausted from the dry suit or is supplied to the dry suit. That is, in order to adjust the air pressure inside the dry suit, the user of the dry suit must operate the buttons disposed on the outside of the dry suit.

SUMMARY OF THE INVENTION

It is therefore an object of the present invention to provide an enclosure for outdoor equipment, which can prevent the enclosure from being damaged by a rise of air pressure inside the enclosure by exhausting air from the enclosure, and further can secure safety of the enclosure and can secure easiness for fixing an inside air pressure adjusting mechanism to the enclosure and also can prevent a dew condensation from occurring in the enclosure.

According to a first aspect of the present invention, for achieving the object mentioned above, there is provided an enclosure for outdoor equipment. The enclosure for outdoor equipment provides an airtight main body in which an electronic instrument and/or an electronic circuit are disposed, and an inside air pressure adjusting mechanism in which a valve seat and a valve shaft part sitting on the valve seat in a state that a place between the valve seat and the valve shaft part can be opened and closed are disposed. And the inside air pressure adjusting mechanism is fixed to the airtight main body, and the inside air pressure adjusting mechanism prevents the atmosphere from entering the airtight main body, and exhausts air inside the airtight main body corresponding to a rise of air pressure inside the airtight main body.

According to a second aspect of the present invention, in the first aspect, the inside air pressure adjusting mechanism is fixed to the airtight main body in a state that the inside air pressure adjusting mechanism does not stick out from the surface of the airtight main body.

According to a third aspect of the present invention, in the second aspect, the inside air pressure adjusting mechanism provides a plate part having a plate in which a hole passing through the plate is formed and a valve seat having a step and a conical shape whose diameter is enlarged toward the outside is formed in the middle of the hole, a valve shaft part in which a flange is formed at one end and an air pressure receiving surface on which air pressure inside the airtight main body is received is formed at the other end, and the valve shaft part is loosely inserted to the hole of the plate part in a state that the inside surface of the flange faces the valve seat by placing a ring shape sealing component between the inside surface of the flange and the valve seat, and an elastic component part which is disposed at a part of the valve shaft part, sticking out from the rear surface of the plate, and makes the valve shaft part sit on the valve seat by pushing the rear surface of the plate in a state that a place between the plate shaft part and the valve seat can be opened and closed. And the airtight main body provides an opening part to which the inside air pressure adjusting mechanism is inserted. And the inside air pressure adjusting mechanism is fixed to the opening part of the airtight main body in a state that the air pressure receiving surface of the valve shaft part faces toward the inside of the airtight main body.

According to a fourth aspect of the present invention, in the second aspect, the inside air pressure adjusting mechanism provides a plate part having a plate in which a hole passing through the plate is formed and plural ventilation holes are formed at the surrounding parts of the hole, a valve shaft part having a shaft, in which a sucker type valve, made of a flexible material and having a curved convex hat shape of a designated size, is fixed to the front side of the shaft, in a state that the sucker type valve is placed on the front surface of the plate by covering the ventilation holes in the plate and the shaft can slide in the hole of the plate and the curved convex hat surface of the sucker type valve is made to be an air pressure receiving surface, and an elastic component part which is disposed at a part of the valve shaft part, sticking out from the rear surface of the plate, and makes the sucker type valve sit on the front surface of the plate by pushing the rear surface of the plate in a state that a place between the sucker type valve and the front surface of the plate can be opened and closed. And the airtight main body provides an opening part to which the inside air pressure adjusting mechanism is inserted. And the inside air pressure adjusting mechanism is fixed to the opening part of the airtight main body in a state that the air pressure receiving surface of the shaft faces toward the inside of the airtight main body.

According to a fifth aspect of the present invention, in the third and fourth aspects, the elastic component part provides a receiving seat which is inserted to a ring shape groove provided at the edge part of the plate shaft part being stuck out from the rear surface of the plate, and an elastic component which is put on the valve shaft part so that the valve shaft part is inserted loosely to the center of the elastic component and pushes the rear surface of the plate.

According to a sixth aspect of the present invention, in the third and fourth aspects, the plate part provides a ring shape groove at the surrounding part of the hole on the rear surface of the plate, and a sealing component inserted to the ring shape groove. And the sealing component keeps airtightness between the airtight main body and the inside air pressure adjusting mechanism.

According to a seventh aspect of the present invention, in the second aspect, the inside air pressure adjusting mechanism provides a bush main part being a cylinder shape having a hole, in which a flange is formed at one end of its outside surface and stoppers made of an elastic material are formed with a designated interval at the other end of its outside surface, and a ring shape groove to which an elastic component was inserted is formed in the middle on its outside surface, and step parts are formed in the middle of its inside surface toward the front and rear directions, and a valve seat is formed at the step part toward the front direction by enlarging the diameter of the hole toward the front direction, a valve shaft part in which a flange is formed at one end and an air pressure receiving surface on which air pressure inside the airtight main body is received is formed at the other end, and the valve shaft part is loosely inserted to the hole of the bush main part in a state that the inside surface of the flange of the valve shaft part faces the valve seat by placing a ring shape sealing component between the inside surface of the flange of the valve shaft part and the valve seat, and an elastic component part which is disposed at a part of the valve shaft part, sticking out from the step of the stopper side of the bush main part, and makes the valve shaft part sit on the valve seat by pushing the step of the stopper side of the bush main part in a state that a place between the plate shaft part and the valve seat can be opened and closed. And the airtight main body provides an opening part, to which the inside air pressure adjusting mechanism is inserted, having a step part matching with the flange of the bush main part. And the inside air pressure adjusting mechanism is fixed to the opening part of the airtight main body by being pushed the front surface of the valve shaft part toward the inside direction until the stoppers are fixed, in a state that the air pressure receiving surface of the valve shaft part faces toward the inside of the airtight main body and the front surface of the valve shaft part and the front surface of the airtight main body become almost the same level.

According to an eighth aspect of the present invention, in the seventh aspect, the elastic component part provides a receiving seat which is inserted to a ring shape groove provided at the edge part of the plate shaft part being stuck out from the step part of the stopper side of the bush main part, and an elastic component which is put on the valve shaft part so that the valve shaft part is inserted loosely to the center of the elastic component and pushes the step part of the stopper side of the bush main part.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the drawings, embodiments of the present invention are explained in detail. An enclosure for outdoor equipment at the embodiments of the present invention is a box shape, in which an electronic instrument and/or an electronic circuit can be disposed and an inside air pressure adjusting mechanism for preventing the atmosphere from entering the enclosure and for exhausting air from the inside of the enclosure corresponding to a rise of air pressure inside the enclosure is provided in one side of the enclosure.

Figure 2:
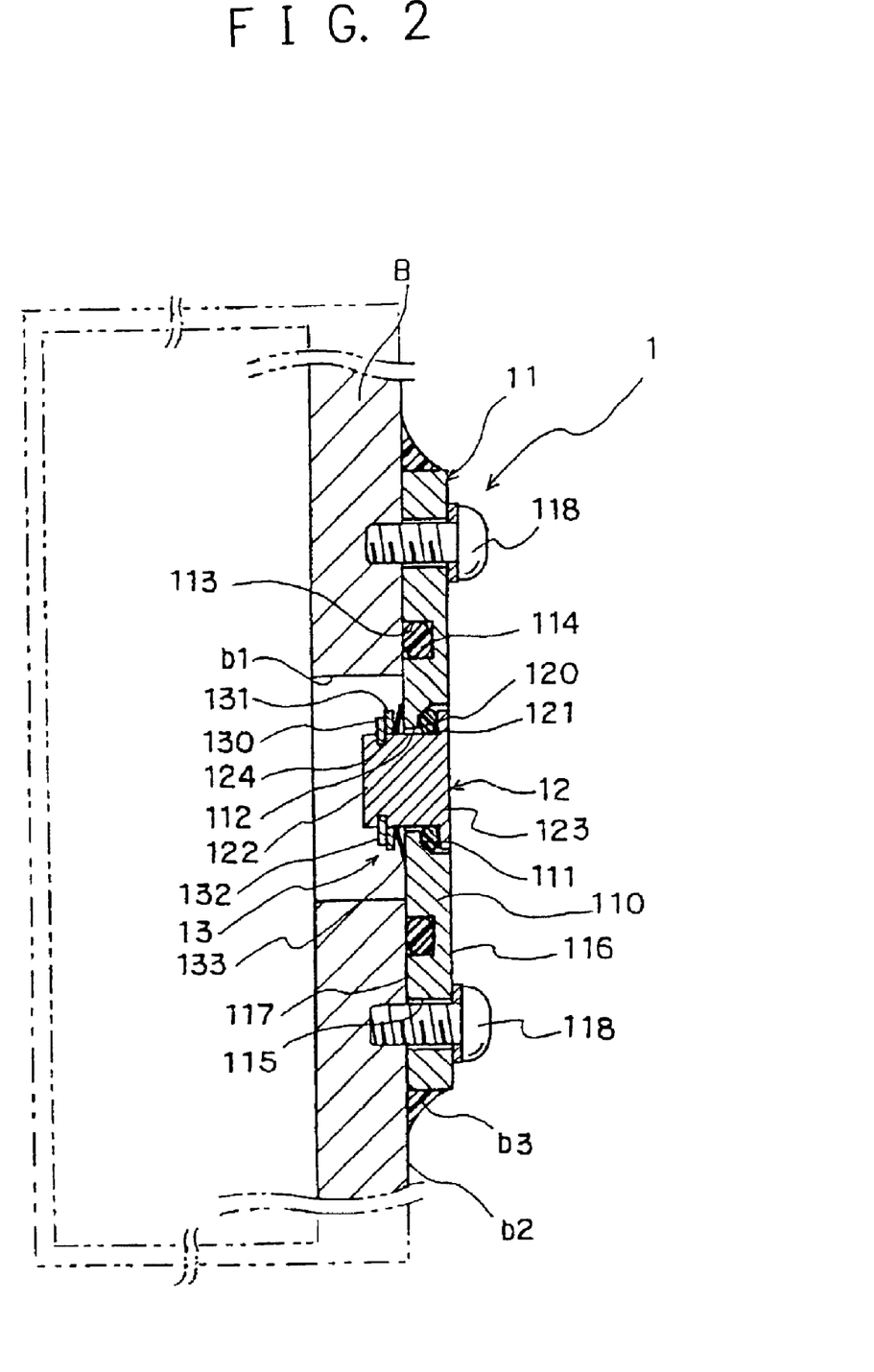
FIG. 2 is a sectional view of a part of an enclosure for outdoor equipment having an inside air pressure adjusting mechanism at a first embodiment of the present invention.
Figure 3:
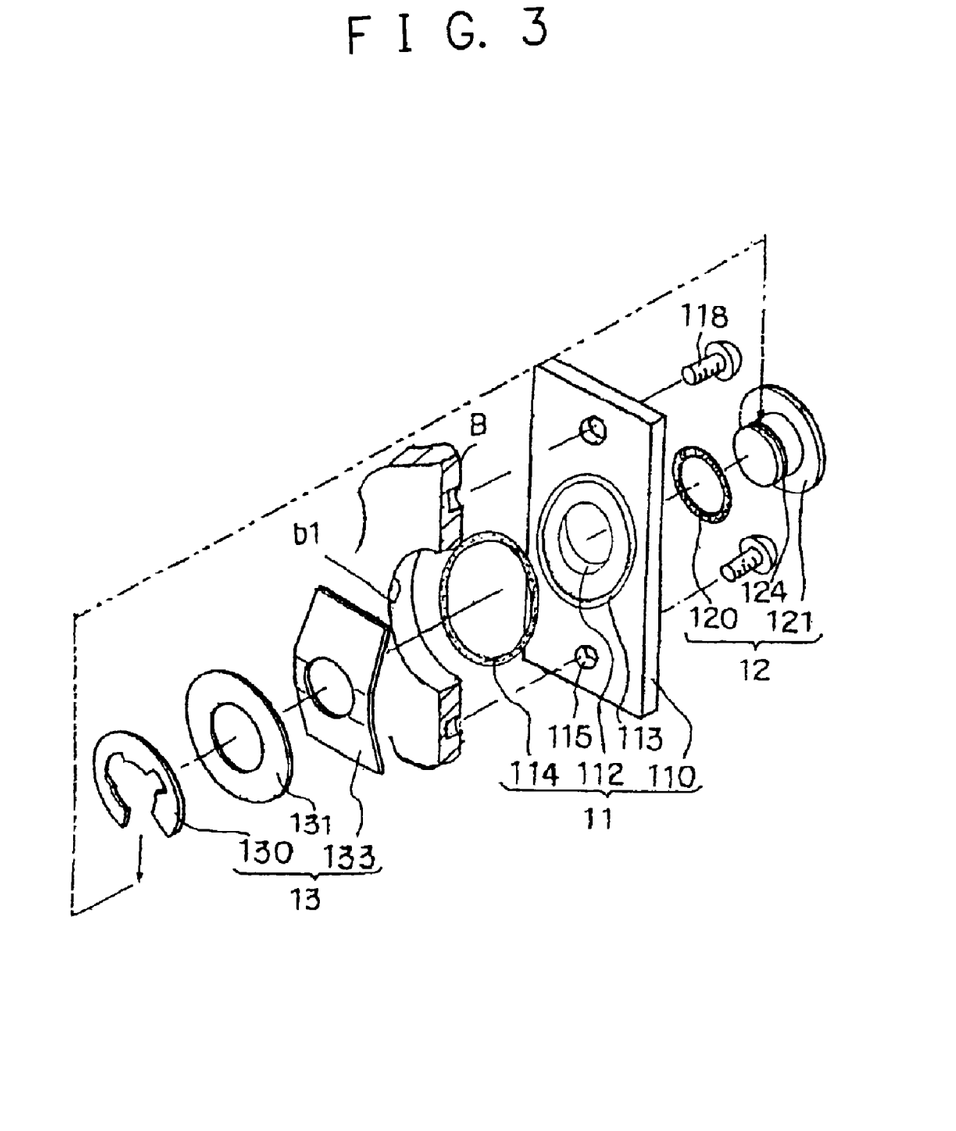
FIG. 3 is a perspective view of a part of the inside air pressure adjusting mechanism shown FIG. 2, in which components in the inside air pressure adjusting mechanism are disassembled.

FIG. 2 is a sectional view of a part of an enclosure for outdoor equipment having an inside air pressure adjusting mechanism at a first embodiment of the present invention. FIG. 3 is a perspective view of a part of the inside air pressure adjusting mechanism shown FIG. 2, in which components in the inside air pressure adjusting mechanism are disassembled. And FIG. 4 is sectional views of a part of the inside air pressure adjusting mechanism shown FIG. 2, in which two cases that a valve element is opened and is closed are shown.

Figure 4:
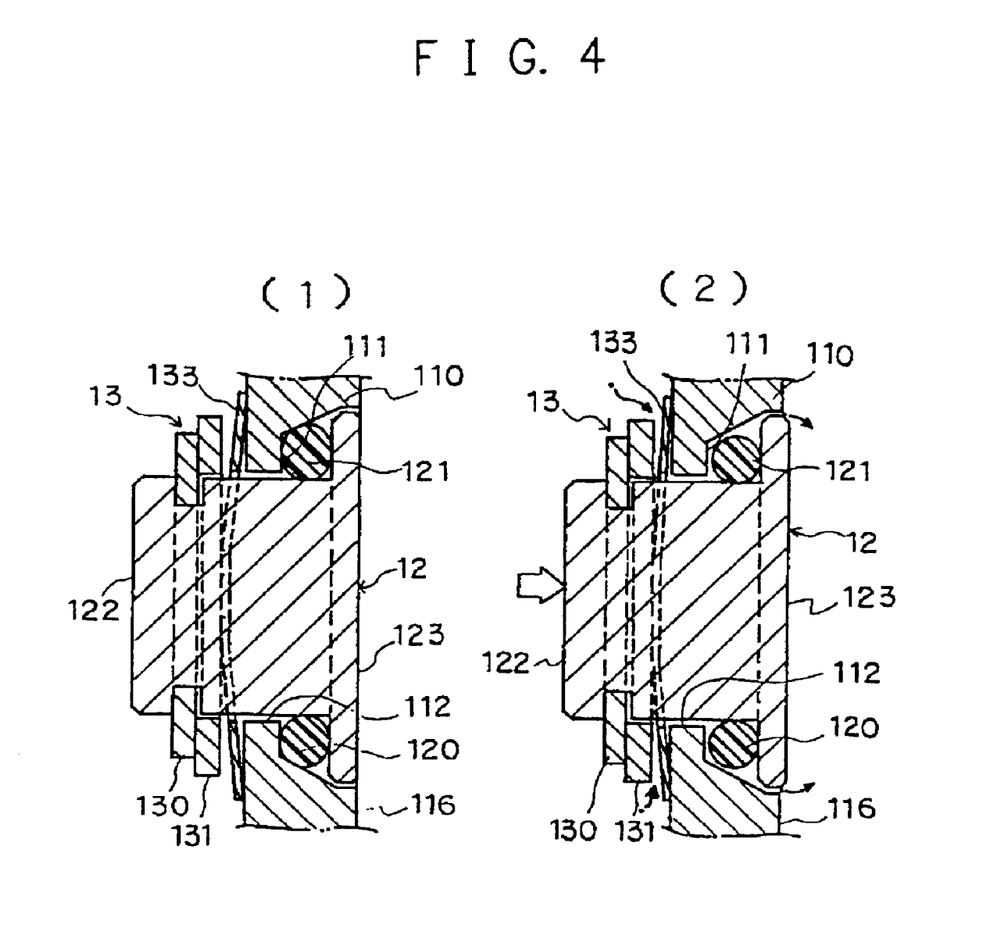
FIG. 4 is sectional views of a part of the inside air pressure adjusting mechanism shown FIG. 2, in which two cases that a valve element is opened and is closed are shown.

Referring to FIGS. 2 to 4, the inside air pressure adjusting mechanism in the enclosure for outdoor equipment at the first embodiment of the present invention is explained. As shown in FIGS. 2 and 3, an inside air pressure adjusting mechanism 1 consists of a plate part 11, a valve shaft part 12, and an elastic component part 13.

In the plate part 11, a connecting hole 112, which passes through a plate 110 having a disk shape or a rectangular shape and has a valve seat 111 in the middle of the connecting hole 112, is formed. The valve seat 111 has a step shape whose bottom surface is flat and has a slanting surface, which is continuously enlarging in the front direction of the inside air adjusting mechanism 1. That is, the valve seat 111 has a conical shape as that its bottom surface is flat. In this, the front direction is the direction toward the outside of the inside air pressure adjusting mechanism. On the rear surface 117 of the plate 110, a ring shape groove 113 is formed as that the connecting hole 112 is made to be its center. In the ring shape groove 113, a sealing component 114 being an O ring is inserted, and plural fixing holes 115 are formed in the plate 110 at the outer side of the ring shape groove 113.

The valve shaft part 12 is formed by a valve element 121, whose one end was formed as a flange and the other end was formed as a bush, a sealing component 120 being an O ring, which is put on the valve element 121, and a ring shape groove 124 formed on the bush part.

The valve shaft part 12 is inserted to the connecting hole 112 so that the flange part of the valve element 121 faces the valve seat 111 by placing the sealing component 120 between the valve element 121 and the valve seat 111. In this, the valve shaft part 12 can slide on the connecting hole 112. The end surface 122 of the bush part of the valve element 121 in the valve shaft part 12 is an air pressure receiving surface where the air pressure inside an airtight main body B is received.

As the O ring using at the sealing component 120, a standard component on the market by Japanese Industrial Standards (JIS) can be used, and as a material of the sealing component 120, acrylonitrile-butadiene rubber (NBR) or silicone rubber is desirable. And its hardness in the range 30° to 70° being relatively soft is desirable to keep air-tightness and durability.

It is formed that the outside surface 123 of the flange part of the valve element 121 becomes the same level of the front surface 116 of the plate 110. With this, the damage for the inside air pressure adjusting mechanism 1, caused by dust or obstacles flown by a storm, can be avoided. From the same reason mentioned above, the outside surface 123 can be formed in a state that the outside surface 123 is more hollow than the front surface 116 by adjusting the thickness of the flange part of the valve element 121.

The elastic component part 13 consists of a receiving seat 132, composed of an E ring 130 and a spacer 131, and an elastic component 133. The E ring 130 is inserted in the ring shape groove 124 formed at the valve element 121 in the valve shaft part 12, which is stuck out from the rear surface 117 of the plate 110. The spacer 131 is put loosely at the bush part of the valve element 121 of the valve shaft part 12. The elastic component 133 is a plate shape elastic component, bent in a shape of <, and is loosely put at the bush part of the valve element 121 of the valve shaft part 12. The valve element 121 can move for the valve seat 111, because the elastic component 133 is disposed between the receiving seat 132 and the rear surface 117 of the plate 110. In this, the elastic component 133 is not limited to the plate shape, but a dish shape, a polygon, or a star shape can be used as the elastic component 133. And a compression coil spring can be used as the elastic component 133. Further, a resin material having elasticity or rubber is formed into a desiring shape, and this formed component can be used as the elastic component 133. As the receiving seat 132, it is possible that the spacer 131 is fixed by a screw from the side, without using the E ring 130. Further, as the receiving seat 132, a screw, a C shape retaining ring, a snap pin, or a speed nut can be used, instead of the E ring 130 and the spacer 131.

Next, the inside air pressure adjusting mechanism 1 mentioned above is fixed on the outside surface b2 of the airtight main body B by inserting screws 118 in the fixing holes 115 so that the end surface 122 (air pressure receiving surface) of the valve shaft part 12 faces an opening part b1 formed at the airtight main body B. After this, the edge of the plate 11 is sealed by a sealing material b3 such as a silicone resin, and air is prevented from flowing except at the valve element 121.

FIG. 4 (1) shows a state that the valve element 121 is closed, and FIG. 4 (2) shows a state that the valve element 121 is opened. When air pressure inside the airtight main body B exceeds air pressure predetermined by a spring constant of the elastic component 133, as shown in FIG. 4 (2), the valve element 121 moves toward the outside, and a gap is formed between the valve element 121 and the valve seat 111. With this, the air inside the airtight main body B flows toward the outside from the gap. After this, when the air pressure inside the airtight main body B falls, the valve element 121 tightly contacts the valve seat 111 again, and the air-tightness of the airtight main body B is kept.

For example, in case that the airtight main body B was closed air-tightly at the ordinary temperature (about 20° C.), when the temperature inside the airtight main body B rises to about 30° C. to 80° C., the air pressure inside the airtight main body B rises. When the elastic component 133 was pushed by even a small length about 0.1 $\mu$m by this rise of the air pressure, the cross section of the pushed sealing component 120 (O ring) tries to restore the shape to its original round shape by its own elasticity, and a small gap is formed between the valve seat 111 and the sealing component 120. As shown in FIG. 4 (2), since the size of the molecule of air is smaller than this length, the air inside the airtight main body B flows to the outside instantaneously by passing through this small gap.

This instantaneous air flow stops at the moment when the force pushing the elastic component 133 by the inside air pressure is balanced with the force pushing the outside surface 123 of the flange part of the valve element 121. And as shown in FIG. 4 (1), the valve shaft part 12 is restored to its original position. When the temperature further falls at this state, the air pressure inside the airtight main body B falls and becomes a low air pressure state. That is, since the force pushing the outside surface 123 by the atmosphere is larger than the force pushing the elastic component 133 by the inside air pressure, as shown in FIG. 4 (1), the sealing component 120 (O ring) contacts tightly with the valve seat 111 and the inside surface of the flange part of the valve element 121. Therefore, as far as the air-tightness is kept at the other parts of the airtight main body B, the atmosphere and dust and a poisonous gas containing in the atmosphere do not enter the airtight main body B. Further, water at a storm does not enter the airtight main body B. That is, in case of a rain with wind, the water pressure pushing the outside surface 123 pushes the sealing component 120 toward the valve seat 111, therefore, the effect of the waterproof is increased.

In case that electronic equipment is disposed in the airtight main body B under the conditions that the temperature is 20° C. and the humidity is 60% (ordinary humidity), the humidity does not become higher than 60%, because the atmosphere does not enter the airtight main body B. Therefore, even at the season when the humidity is high, the humidity in the airtight main body B is kept almost in a constant value, and the dew condensation can be prevented.

It is enough that the size of the gap between the valve seat 111 and the sealing component 120 is a size through which the air inside the airtight main body B can flow. Therefore, it is desirable that the gap is less than 0.2 mm to prevent a small insect from entering the airtight main body B.

At the first embodiment of the present invention, the sealing component 120 being O ring was put at the valve element 121 in the valve shaft part 12. However, the valve shaft part 12 can be formed by unifying a ring shape silicone rubber with the valve element by an inserting forming. That is, the forming the valve shaft part is not limited to the forming method mentioned above.

Figure 5:
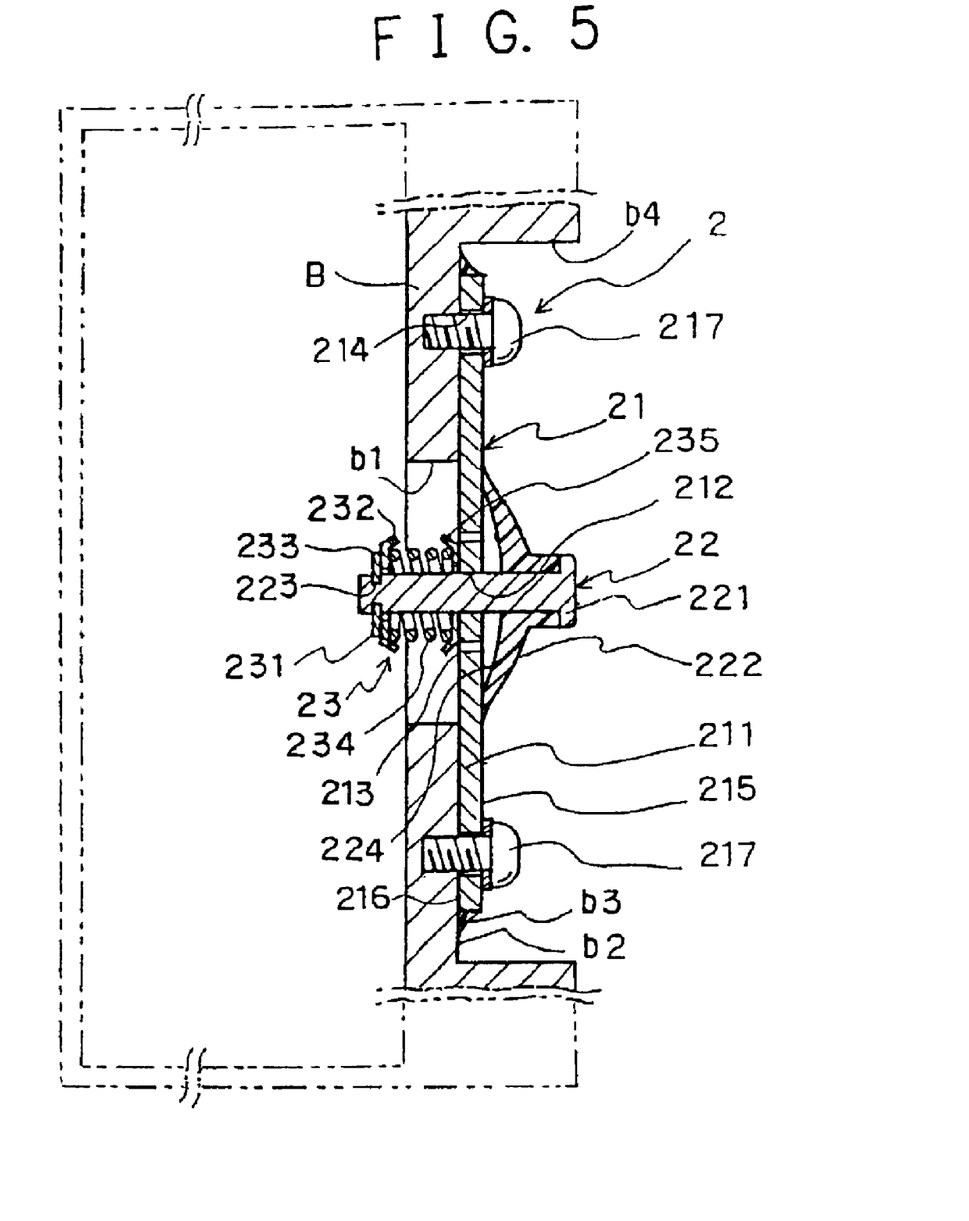
FIG. 5 is a sectional view of a part of an inside air pressure adjusting mechanism in an enclosure for outdoor equipment at a second embodiment of the present invention.

Next, referring to the drawing, an inside air pressure adjusting mechanism at a second embodiment of the present invention is explained. FIG. 5 is a sectional view of a part of the inside air pressure adjusting mechanism in the enclosure for outdoor equipment at the second embodiment of the present invention.

As shown in FIG. 5, an inside air pressure adjusting mechanism 2 in the enclosure for outdoor equipment at the second embodiment of the present invention consists of a plate part 21, a valve shaft part 22, and an elastic component part 23.

The plate part 21 is a plate 211 whose shape is circular or rectangular. In the plate 211, a hole 212 is formed at its center, and plural ventilation holes 213 are formed at the surrounding part of the hole 212, and plural fixing holes 214 are formed at the edge of the plate 211.

The valve shaft part 22 consists of a shaft 221 and a sucker type valve 222. The sucker type valve 222 is a hat shape being curved and has flexibility, and is fixed to the shaft 221 so that the shaft 221 passes through the center of the sucker type valve 222. A ring shape groove 223 is formed at the part near the edge of the shaft 221. And the valve shaft part 22 is inserted to the hole 212 of the plate part 21 so that the sucker type valve 222 is disposed on the side of the front surface 215 of the plate 211 and also the shaft 221 can slide in the hole 212. The inside curved surface 224 of the sucker type valve 222 becomes an air pressure receiving surface, which receives air pressure inside the airtight main body B through the ventilation holes 213.

The size (outside diameter) of the sucker type valve 222 can be set arbitrarily by air pressure by which the sucker type valve 222 is moved. That is, the size of the sucker type valve 222 is set based on the temperature inside the airtight main body B, and the temperature can be set to be relatively low temperature. For example, in case that the size is set to be about 20 mm, the sucker type valve 222 can move at the temperature of about 35° C. to 60° C.

The elastic component part 23 consists of a receiving seat 233, composed of an E ring 231 and a first spacer 232, an elastic component 234, and a second spacer 235. The E ring 231 is inserted in the ring shape groove 223 formed at the shaft 221 in the valve shaft part 22, which is stuck out from the rear surface 216 of the plate 211. The first spacer 232 is put loosely at the shaft 221 of the valve shaft part 22. The elastic component 234 is a compression spring being a coil type, and is loosely put at the shaft 221 of the valve shaft part 22 so that the shaft 221 passes through the center of the elastic component 234. The second spacer 235 is disposed at the position near the rear surface 216 of the plate 211 so that the shaft 221 passes through the center of the second spacer 235. And the elastic component 234 is placed between the first spacer 232 and the second spacer 235. With this structure, the rim of the sucker type valve 222 is pushed toward the front surface 215 of the plate 211 so that the sucker type valve 222 covers the ventilation holes 213.

Next, the inside air pressure adjusting mechanism 2 mentioned above is fixed on the outside surface b2 of the airtight main body B by inserting screws 217 in the fixing holes 214 so that the inside curved surface 224 (air pressure receiving surface) of the sucker type valve 222 faces an opening part b1 formed at the center of the concave part b4 on the airtight main body B. After this, the edge part of the plate 21 is sealed with a sealing material b3 such as a silicone resin, and air is prevented from flowing except at the sucker type valve 222. The depth of this concave part b4 of the airtight main body B is set so that the top of the valve shaft part 22 does not stick out from the front surface of the airtight main body B.

When air pressure inside the airtight main body B rose corresponding to the rise of the temperature, the air pressure passed through the ventilation holes 213 pushes the inside curved surface 224 (air pressure receiving surface) toward the outside against the force of the elastic component 234 (compression spring). The air passed through the ventilation holes 213 spreads in all directions along the inside curved surface 224 of the sucker type valve 222, and the air flows to the outside by passing through the place between the front surface 215 of the plate 211 and the rim part of the sucker type valve 222.

When air pressure inside the airtight main body B fell corresponding to the fall of the temperature, the air pressure inside the airtight main body B becomes lower than the atmosphere. Consequently, the sucker type valve 222 is contacted tightly with the front surface 215 of the plate 211. And the atmosphere does not flow in the airtight main body B.

Figure 6:
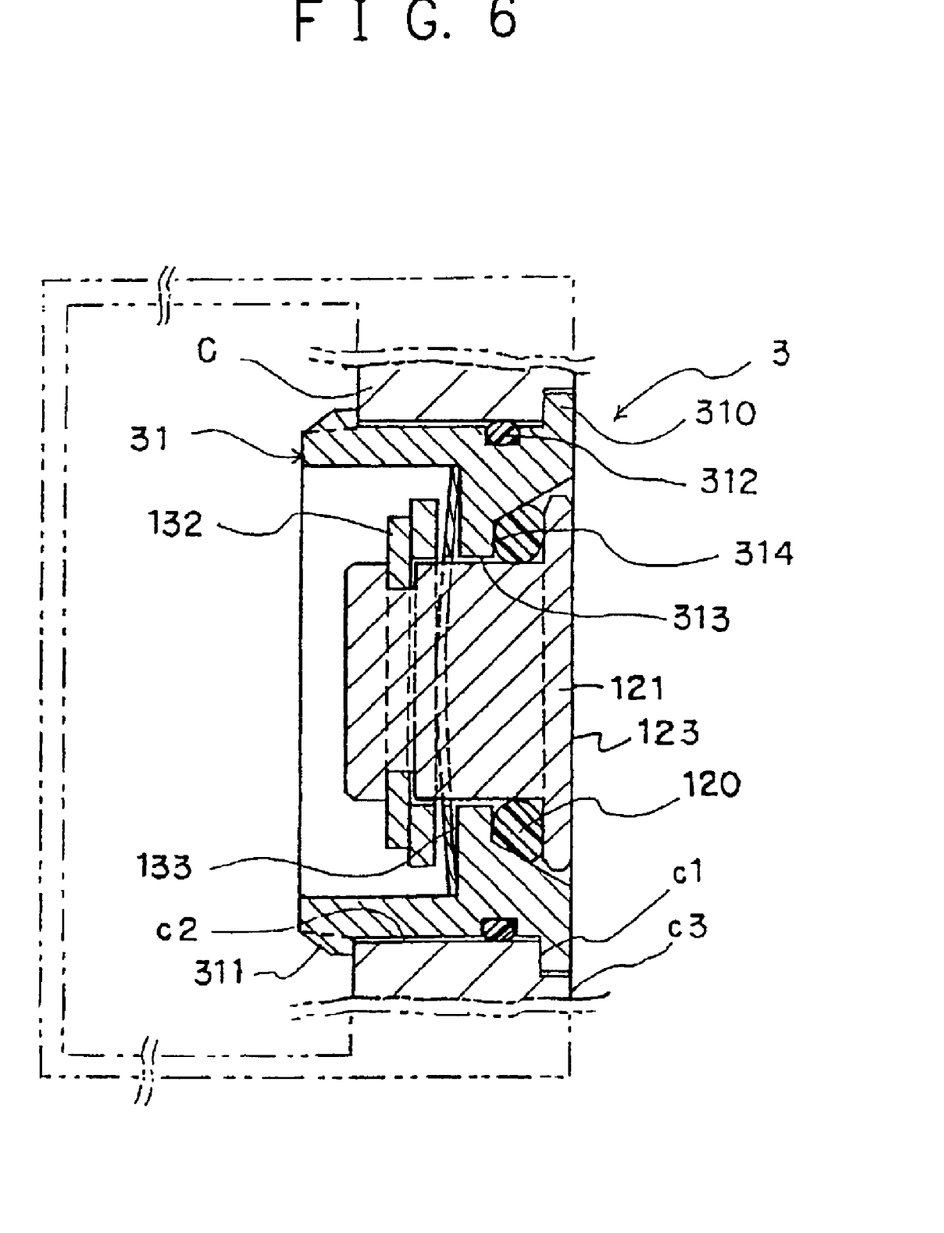
FIG. 6 is a sectional view of a part of an inside air pressure adjusting mechanism in an enclosure for outdoor equipment at a third embodiment of the present invention.

Next, referring to the drawing, an inside air pressure adjusting mechanism in an enclosure for outdoor equipment at a third embodiment of the present invention is explained. FIG. 6 is a sectional view of a part of the inside air pressure adjusting mechanism in the enclosure for outdoor equipment at the third embodiment of the present invention.

As shown in FIG. 6, at an inside air pressure adjusting mechanism 3 in the enclosure for outdoor equipment at the third embodiment of the present invention, the plate part 11 at the first embodiment is changed to a plate part which is formed as a bush type so that the plate part can be inserted to an airtight main body C from the outside. This plate part is named as a bush main part 31. Each component in the valve shaft part 12 and the elastic component part 13 has the same reference number as the first embodiment has, and the detailed explanation about them are omitted.

The bush main part 31 has a cylindrical shape having a hole. At the outside surface of the bush main part 31, a flange 310 is formed at one end and stoppers 311 made of an elastic material are formed at the other end. Further, on the outside surface of the bush main part 31, a ring shape groove is formed between the flange 310 and the stoppers 311, and a sealing component 312 being an O ring is inserted in the ring shape groove. In the middle of the inside of the bush main part 31, a step part 313 is formed. And a valve seat 314 having a conical shape is formed by enlarging the diameter of the valve seat 314 toward the front of the bush main part 31 as the step part 313 is a flat.

After this, the valve element 121 is inserted to the bush main part 31 by placing the sealing component 120 (O ring) between them, and the elastic component 133 and the receiving seat 132 composed of the E ring 130 and the spacer 131 are put on the valve element 121. With this, the valve element 121 is seated on the valve seat 314.

The airtight main body C has an opening part c2 to which the valve element 121 including the sealing component 120 (O ring) is inserted and a step part c1 at which the flange 310 of the bush main part 31 is stopped. And the bush main part 31, in which the valve element 121 including the sealing component 120 was assembled, is inserted to the opening part c2 by bending the stoppers 311 by that the outside surface 123 of the valve element 121 is pushed. And the inside surface of the flange 310 is contacted with the step part c1, and the bush main part 31, in which the valve element 121 including the sealing component 120 was assembled, is hold by the airtight main body C by the stoppers 311 and the flange 310. At this time, the sealing component 312 keeps the air-tightness of the airtight main body C by pushing the inside surface of the opening part c2. Further the surfaces of the front surface c3 of the airtight main body C, the outside surface 123 of the flange part of the valve element 121, and the front surface of the bush main part 31 are made to be an equal level.

As mentioned above, according to the enclosure for outdoor equipment of the present invention, when the temperature inside the enclosure rises, the air inside the enclosure is made to flow to the outside, and even when the air pressure inside the enclosure falls by the fall of temperature inside the enclosure, the atmosphere and water do not enter the enclosure. Therefore, sulfur dioxide, salt containing particles, metal particles, and so fourth, which entered the enclosure at the use of the tetrafluoro-ethylene resin filter, are prevented from entering the enclosure for outdoor equipment of the present invention. Consequently, the reliability of an electronic instrument and/or an electronic circuit inside the enclosure cannot be lowered by accumulating the sulfur dioxide, the salt containing particles, the metal particles, and so fourth inside the enclosure. Further, it is avoided that the filter is clogged at the use of the tetrafluoro-ethylene resin filter after a long time usage, and the durability of the enclosure for outdoor equipment can be improved. Moreover, even at the time when the humidity is high, the humidity inside the enclosure is kept in a certain value, therefore, the occurrence of the dew condensation can be lowered.

Moreover, according to the enclosure for outdoor equipment of the present invention, the inside air pressure adjusting mechanism, which makes the valve element open or close, is disposed inside the enclosure, that is, parts sticking out from the enclosure are eliminated as many as possible. Therefore, it is avoided that the inside air pressure adjusting mechanism is damaged by a collision of users or by hitting of flowing objects caused by a storm.

Further, the inside air pressure adjusting mechanism of the enclosure for outdoor equipment of the present invention is formed as a unit and can be fixed to an enclosure after the enclosure is formed. Therefore, the inside air pressure adjusting mechanism of the present invention can be fixed to a conventional enclosure, and also its maintenance can be executed easily. And at the inside air pressure adjusting mechanism of the enclosure for outdoor equipment of the present invention, entering insects in the enclosure is prevented without using a special means for preventing the insects from entering. And in case that the bush type inside air pressure adjusting mechanism is adopted, it is very easy to fix the mechanism to the enclosure. Further, by that the outside surface of the mechanism is made to be equal to the front surface of the enclosure, the enclosure for outdoor equipment having high safety without having sticking out parts can be realized.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An enclosure for outdoor equipment, comprising:
    an airtight main body; and
    an inside air pressure adjusting mechanisms,
    wherein said inside air pressure adjusting mechanism comprises:
        a plate part having a plate in which a hole passing through said plate is formed,
        a valve seat formed in said hole having a step and a conical shape, and whose diameter is enlarged toward the outside of said airtight main body,
        a valve shaft part in which a flange is formed at one end and an air pressure receiving surface on which air pressure inside said airtight main body is received is formed at the other end, and
        said valve shaft part sits on said valve seat such that a place between said valve seat and said valve shaft part can be opened and closed, and said valve shaft part is loosely inserted into said hole of said plate part such that an inside surface of said flange faces said valve seat and a ring shape sealing component is disposed between said inside surface of said flange and said valve seat; and
        an elastic component, which is disposed at a part of said valve shaft part which sticks out from a rear surface of said plate, makes said valve shaft part sit on said valve seat by pushing the rear surface of said plate such that a place between said plate shaft part and said valve seat can be opened and closed, and
    said airtight main body comprises:
        an opening part into which said inside air pressure adjusting mechanism is inserted, wherein said inside air pressure adjusting mechanism is fixed to said opening part of said airtight main body such that said air pressure receiving surface of said valve shaft part faces toward the inside of said airtight main body,
    wherein said inside air pressure adjusting mechanism is fixed to said airtight main body, and said inside air pressure adjusting mechanism prevents the atmosphere from entering said airtight main body, and exhausts air inside said airtight main body corresponding to a rise of air pressure inside said airtight main body.

2. The enclosure for outdoor equipment in accordance with claim 1, wherein:
    said inside air pressure adjusting mechanism is fixed to said airtight main body such that said inside air pressure adjusting mechanism does not stick out from the surface of said airtight main body.

3. The enclosure for outdoor equipment in accordance with claim 2, wherein:
    said elastic component part, further comprises;
    a receiving seat which is inserted to a ring shape groove provided at the edge part of said plate shaft part being stuck out from said rear surface of said plate part; and
    an elastic component which is disposed on said valve shaft part so that said valve shaft part is inserted loosely to the center of said elastic component and pushes said rear surface of said plate.

4. The enclosure for outdoor equipment in accordance with claim 2, wherein:
    said plate part, further comprises:
    a ring shape groove at the surrounding part of said hole on said rear surface of said plate; and
    a sealing component inserted into said ring shape groove, wherein
    wherein said sealing component keeps air-tightness between said airtight main body and said inside air pressure adjusting mechanism.

5. The enclosure for outdoor equipment in accordance with claim 1, wherein:
    said elastic component part further comprises:
    a receiving seat which is inserted into a ring shape groove provided at the edge part of said plate shaft part being stuck out from said rear surface of said plate part; and
    an elastic component which is disposed on said valve shaft part so that said valve shaft part is inserted loosely to the center of said elastic component and pushes said rear surface of said plate.

6. The enclosure for outdoor equipment in accordance with claim 1, wherein:
    said plate part further comprises:
    a ring shape groove at the surrounding part of said hole on said rear surface of said plate; and
    a sealing component inserted to said ring shape groove, wherein:
        said sealing component keeps air-tightness between said airtight main body and said inside air pressure adjusting mechanism.

7. An enclosure for outdoor equipment, comprising:
    an airtight main body; and
    an inside air pressure adjusting mechanism,
    wherein said inside air adjusting mechanism comprises,
        a bush main part being a cylinder shape having a hole, and in which a flange is formed at one end of its outside surface and stoppers made of an elastic material are formed with a designated interval at the other end of its outside surface, and a ring shape groove to which an elastic component is inserted is formed in the middle on its outside surface, and step parts are formed in the middle of its inside surface toward the front and rear directions, and a valve seat is formed at the step part toward the front direction by enlarging the diameter of said hole toward the front direction;

a valve shaft part in which a flange is formed at one end and an air pressure receiving surface on which air pressure inside said airtight main body is received is formed at the other end, and said valve shaft part is loosely inserted to said hole of said bush main part in a state that the inside surface of said flange of said valve shaft part faces said valve seat by placing a ring shape sealing component between said inside surface of said flange of said valve shaft part and said valve seat; and an elastic component part which is disposed at a part of said valve shaft part, sticking out from said step of said stopper side of said bush main part, and makes said valve shaft part sit on said valve seat by pushing said step of said stopper side of said bush main part in a state that a place between said plate shaft part and said valve seat can be opened and closed, wherein said valve shaft part sits in said valve seat such that a place between said valve seat and said valve shaft part can be opened and closed are disposed, and wherein said inside air pressure adjusting mechanism is fixed to said airtight main body, and said inside air pressure adjusting mechanism prevents the atmosphere from entering said airtight main body, and exhausts air inside said airtight main body corresponding to a rise of air pressure inside said airtight main body wherein:

said airtight main body comprises:

an opening part, to which said inside air pressure adjusting mechanism is inserted, having a step part matching with said flange of said bush main part, wherein said inside air pressure adjusting mechanism is fixed to said opening part of said airtight main body by being pushed the front surface of said valve shaft part toward the inside direction until said stoppers are fixed, in a state that said air pressure receiving surface of said valve shaft part faces toward the inside of said airtight main body and said front surface of said valve shaft part and said front surface of said airtight main body become almost the same level.

8. The enclosure for outdoor equipment in accordance with claim 7, wherein:

said elastic component part further comprises:

a receiving seat which is inserted into a ring shape groove provided at the edge part of said plate shaft part being stuck out from said step part of the stopper side of said bush main part; and an elastic component which is put on said valve shaft part so that said valve shaft part is inserted loosely to the center of said elastic component and pushes said step part of the stopper side of said bush main part.

9. The enclosure for outdoor equipment in accordance with claim 7, wherein:

said elastic component part comprises:

a receiving seat which is inserted to a ring shape groove provided at the edge part of said plate shaft part being stuck out from said step part of the stopper side of said bush main part; and an elastic component which is put on said valve shaft part so that said valve shaft part is inserted loosely to the center of said elastic component and pushes said step part of the stopper side of said bush main part.

\* \* \* \* \*